(12) United States Patent
Fündling et al.

(10) Patent No.: US 11,967,666 B2
(45) Date of Patent: Apr. 23, 2024

(54) SEMICONDUCTOR DEVICE FOR TRANSMITTING ELECTROMAGNETIC RADIATION AND METHOD FOR PRODUCTION THEREOF

(71) Applicant: Technische Universität Braunschweig Körperschaft Des Öffentlichen Rechts, Braunschweig (DE)

(72) Inventors: Sönke Fündling, Braunschweig (DE); Frederik Steib, Wolfsburg (DE); Andreas Waag, Würzburg (DE)

(73) Assignee: Technische Universität Braunschweig Korperschaft Des Offentlichen Rechts, Braunschweig (DE)

( * ) Notice: Subject to any disclaimer, the term of this patent is extended or adjusted under 35 U.S.C. 154(b) by 857 days.

(21) Appl. No.: 16/978,641

(22) PCT Filed: Mar. 7, 2018

(86) PCT No.: PCT/EP2018/055599
§ 371 (c)(1),
(2) Date: Dec. 10, 2020

(87) PCT Pub. No.: WO2019/170226
PCT Pub. Date: Sep. 12, 2019

(65) Prior Publication Data
US 2022/0109086 A1    Apr. 7, 2022

(51) Int. Cl.
*H01L 33/38* (2010.01)
*H01L 27/15* (2006.01)
(Continued)

(52) U.S. Cl.
CPC .......... *H01L 33/387* (2013.01); *H01L 27/153* (2013.01); *H01L 33/0062* (2013.01);
(Continued)

(58) Field of Classification Search
CPC ....... H01L 27/156; H01L 33/44; H01L 33/30; H01L 27/153; H01L 33/62; H01L 33/387;
(Continued)

(56) References Cited

U.S. PATENT DOCUMENTS 6,410,940 B1   6/2002   Jiang et al.
7,009,589 B1   3/2006   Komiya et al.
(Continued)

FOREIGN PATENT DOCUMENTS

DE          196 45 035 C1    4/1998
DE    10 2004 019 567 B3    1/2006
(Continued)

OTHER PUBLICATIONS

International Search Report and Written Opinion for International Application No. PCT/EP2018/055599, dated Nov. 2, 2018.
(Continued)

*Primary Examiner* — Savitri Mulpuri
(74) *Attorney, Agent, or Firm* — Wolf, Greenfield & Sacks, P.C.

(57) ABSTRACT

A semiconductor device for emitting electromagnetic radiation, and to a method of producing the same, which can be used as a semiconductor-based, structured light source. The semiconductor device comprises a layer stack structure composed of an n-doped layer, an active layer and a p-doped layer, as well as a connection structure comprising conductor layers and at least one insulator layer, the conductor layers being arranged, parallel to and spaced apart from one another, along a first direction that is parallel to the active layer of the layer stack structure, and at least one insulator layer being arranged between at least two conductor layers, one or more conductor layers being electrically connected to the p-doped layer of the layer stack structure.

11 Claims, 7 Drawing Sheets

(51) Int. Cl.
- *H01L 33/00* (2010.01)
- *H01L 33/30* (2010.01)
- *H01L 33/32* (2010.01)
- *H01L 33/44* (2010.01)

(52) U.S. Cl.
CPC .......... *H01L 33/0075* (2013.01); *H01L 33/30* (2013.01); *H01L 33/32* (2013.01); *H01L 33/44* (2013.01); *H01L 2933/0016* (2013.01); *H01L 2933/0025* (2013.01)

(58) Field of Classification Search
CPC . H01L 33/32; H01L 33/0075; H01L 33/0062; H01L 2933/0066; H01L 33/38; H01L 2933/0016; H01L 25/0753; H01L 33/20; H01L 2933/0025
See application file for complete search history.

(56) References Cited

U.S. PATENT DOCUMENTS

| | | | |
|---|---|---|---|
| 7,906,787 B2 | 3/2011 | Kang et al. | |
| 11,038,083 B2* | 6/2021 | Singer | H01L 33/486 |
| 11,063,182 B2* | 7/2021 | Sundgren | H01L 33/30 |
| 11,177,414 B2* | 11/2021 | Varghese | H01L 33/0066 |
| 11,195,974 B2* | 12/2021 | Enzmann | H01L 33/382 |
| 2008/0297453 A1 | 12/2008 | Ray et al. | |
| 2011/0073838 A1 | 3/2011 | Khan et al. | |
| 2011/0156616 A1 | 6/2011 | Anderson et al. | |
| 2011/0303893 A1 | 12/2011 | Wagner et al. | |
| 2014/0061687 A1 | 3/2014 | Hu et al. | |
| 2015/0034997 A1 | 2/2015 | Tajima et al. | |
| 2015/0380459 A1 | 12/2015 | Bono et al. | |

FOREIGN PATENT DOCUMENTS

| | | |
|---|---|---|
| DE | 10 2004 056 702 B3 | 3/2006 |
| EP | 0 011 418 A1 | 5/1980 |
| EP | 0 905 673 A1 | 3/1999 |
| EP | 1 652 238 B1 | 10/2010 |
| WO | WO 2007/034367 A1 | 3/2007 |
| WO | WO 2009/081325 A1 | 7/2009 |

OTHER PUBLICATIONS

International Preliminary Report on Patentability for International Application No. PCT/EP2018/055599, DATED Sep. 17, 2020.
Examination Report for European Application No. 18711259.4, dated Jun. 29, 2023.

* cited by examiner

Fig.7

SEMICONDUCTOR DEVICE FOR TRANSMITTING ELECTROMAGNETIC RADIATION AND METHOD FOR PRODUCTION THEREOF

CROSS REFERENCE TO RELATED APPLICATION

This Application is a national stage filing under 35 U.S.C. § 371 of International Patent Application Serial No. PCT/EP2018/055599, filed Mar. 7, 2018. entire contents of this application is incorporated herein by reference in its entirety.

FIELD OF THE INVENTION

The present invention relates to a semiconductor device for emitting electromagnetic radiation and to a production method for producing the semiconductor device, and in particular to a semiconductor device that can emit electromagnetic radiation from small surface elements in the sub-micrometre range to micrometre range.

TECHNICAL BACKGROUND

Fluorescence microscopy is conventionally used in the context of biological examinations. The information obtained with this technique is only informative, however, if the fluorescence is spatially reduced to certain parts of the specimen. Another problem in the context of biological examinations is phototoxicity, whereby cells can be damaged when irradiated with short-wave electromagnetic radiation, especially in the ultraviolet spectrum.

In order to achieve a good spatial delimitation of the fluorescence, some biological examinations require the use of very small probes, having flexible power supply leads, for emitting electromagnetic radiation.

Other techniques in the context of biological and biochemical examinations are 3D structured illumination microscopy (3D-SIM) and so-called localization microscopy. Using 3D-SIM, a specimen is illuminated with particular stripe patterns. By superimposing these illumination patterns, a high resolution above the conventional resolution limit can then be achieved by means of the Moiré effect. Using localization microscopy, successive parts of a sample are excited. By back-calculating the fluorescence data obtained in this way, very accurate images can be obtained.

One possibility for obtaining this structured illumination, and thus achieving a particular resolution, are matrices consisting of light-emitting diodes, for example micro-LED arrays. Usually in this case, each diode is controlled individually within a matrix.

These diode matrices conventionally have spatial dimensions in the range of a few centimetres with pixels in the sub-millimetre range. As a result, they provide a relatively low resolution and have inflexible power supply leads, which makes them unsuitable for many biological examinations, especially in vivo.

SUMMARY OF THE INVENTION

The invention is based on the object of providing an improved semiconductor device for emitting electromagnetic radiation, and a corresponding production method for the same. In particular, it is an aim to provide a compact semiconductor device as a semiconductor-based, structured light source, and a method for producing the same.

This object is achieved by the semiconductor device having the features recited in the claims and by a production method having the features recited in the claims. Advantageous embodiments are described in the subclaims.

According to one embodiment, the semiconductor device for emitting electromagnetic radiation comprises at least one layer stack structure having at least one semiconductor material. This layer stack structure consists of at least one n-doped layer, at least one active layer, which is designed to emit electromagnetic radiation during operation, and at least one p-doped layer. The layers are arranged in parallel one above the other, and the active layer is located between an n-doped and a p-doped layer. Furthermore, the semiconductor device includes a connection structure comprising conductor layers and at least one insulator layer. The conductor layers in this case are arranged, parallel to and spaced apart from one another, along a first direction that is parallel to the active layer of the layer stack structure. At least one insulator layer is arranged between at least two conductor layers. One or more conductor layers are electrically connected to the p-doped layer of the layer stack structure.

It is thus possible to realize an electromagnetic-radiation emitting semiconductor device that can emit structured electromagnetic radiation. Use of the lamellar-type connection structure, composed of at least two conductor layers, enables the semiconductor device to be greatly reduced in size and made compact. In particular, a reduction in the cross-section of the device is possible, which can be formed in such a manner that the layer stack structure is not significantly larger than the area of light emission.

According to an advantageous embodiment, at least a part of the edge of the one or more conductor layers of the connection structure is electrically connected to the p-doped layer of the layer stack structure.

A low current expansion can thus be generated in the correspondingly contacted p-doped regions. As a result, an emission of electromagnetic radiation can be generated, which is limited substantially to the extent of the corresponding contact points, or connection points. This allows the achievable resolution to be significantly influenced, or increased.

According to an advantageous embodiment, the layer stack structure is electrically subdivided by the insertion of at least one insulator layer. This creates at least two partial layer stacks. These are arranged, parallel to and spaced apart from one another, along a second direction that is parallel to the active layer of the layer stack structure.

The lateral current expansion, along the second direction, can thus be limited to the spatial extent of the respective partial layer stacks.

As a result, a very low current expansion can be generated in the correspondingly contacted p-doped regions. Consequently, the emission of electromagnetic radiation can be further spatially limited, and the achievable resolution can be further increased.

According to a further advantageous embodiment, the at least two partial layer stacks obtained thus are formed in such a way that they have a longitudinal axis orthogonal to the second direction.

It is thus possible to produce at least two partial layer stacks that have a bar shape having a perfect longitudinal axis.

According to an advantageous embodiment, the at least two partial layer stacks are aligned in such a manner that a respective conductor layer of the connection structure is electrically connected to at most one p-doped layer of a respective partial layer stack.

A linear emission of electromagnetic radiation, limited to the region of the electrical connection points, can thus be achieved. Furthermore, the intensity of the emitted electromagnetic radiation can be controlled by the number of conductor layers connected to a respective partial layer stack.

According to an advantageous embodiment, the at least two partial layer stacks are aligned in such a manner that a respective conductor layer of the connection structure is electrically connected to the p-doped layer of the first partial layer stack and to the p-doped layer of the second partial layer stack of the at least two partial layer stacks.

It is thus possible to achieve a matrix-type structured emission of electromagnetic radiation that in each case is limited to the region of the electrical connection points. For example, a plurality of very small pixels, arranged according to a pattern along a line, could be realized.

According to an advantageous embodiment, the connection structure is arranged substantially perpendicularly in relation to the layer stack structure.

Since the connection structure and its layers are attached substantially perpendicularly in relation to the underside of the layer stack, the light-emitting area corresponds substantially to the cross-section of the semiconductor device, or, in other words, the plan view of the semiconductor device against the direction of light emission. Thus, the size of the cross-section of the semiconductor device can be reduced.

According to an advantageous embodiment, the n-doped layer is electrically contacted.

An emission of electromagnetic radiation by the semiconductor device can thus be realized.

According to an advantageous embodiment, a respective conductor layer and a respective n-doped layer are electrically connected vertically in relation to the n-doped layer. Alternatively, a respective conductor layer and a respective n-doped layer are electrically connected parallel to the n-doped layer.

The size of the semiconductor device can thus be further reduced. Furthermore, an advantageous pixelated control can thereby be achieved. In the case of pixelated control, a combination of at least one p-doped layer and at least one n-doped layer is controlled such that one or more pixels (respective portion of an active layer of a respective partial layer stack) emit light.

According to one embodiment, the conductor layers of the connection structure are each individually electrically contacted.

Thus, the individual conductor layers in the connection structure can be controlled individually, this rendering possible, for example, the generation of differing line patterns, or patterns composed of a plurality of spatially very limited pixels.

According to one embodiment, the conductor layers and/or the insulator layers of the connection structure each have a layer thickness of 10-5000 nm, and preferably of 200-2000 nm.

The size of the semiconductor device, in particular its cross-section, which corresponds substantially to the light emission area, can thus be greatly reduced, for example to the millimetre/micrometre range, with small surface elements for light emission in the sub-micrometre range or micrometre range. Furthermore, the use of the very thin conductor layers and insulator layers, by greatly limiting the current expansion in the p-doped layer of the layer stack, or partial layer stack, connected to a conductor layer, renders possible an effective spatial limitation of the emission of electromagnetic radiation to the low micrometre range, or sub-micrometre range, of the contact points.

According to one embodiment, a respective partial layer stack of the at least two partial layer stacks of the layer stack structure has an extent of 50-5000 nm, and preferably of 200-2000 nm, vertically in relation to its longitudinal axis.

The current expansion within a direction can thus be reduced to the above orders of magnitude of the extent of a partial layer stack. Thus it is possible to spatially limit the emission of electromagnetic radiation further to the above expansion scale of the partial layer stacks.

According to one embodiment, the layer stack structure is based on the material system of the group III nitrides or the group III phosphides or the group III arsenides.

According to one embodiment, the active layer comprises at least one semiconductor material from the group of (Al, In, Ga)N, (Al, In, Ga)P, (Al, In, Ga)As. Furthermore, quaternary systems such as, for example, AlInGaN, are also possible.

The emission of electromagnetic radiation can thus be stimulated in particular wavelength ranges. Examples are wavelength ranges in the visible spectrum, the colours blue, red or yellow, and the wavelength ranges in the ultraviolet and infrared part of the spectrum.

According to one embodiment, a method of producing a semiconductor device for emitting electromagnetic radiation comprises producing a layer stack structure, having at least one semiconductor material, by superimposing an n-doped layer, an active layer designed to emit electromagnetic radiation during operation, and a p-doped layer. The active layer in this case is located between an n-doped and a p-doped layer. Furthermore, this method comprises producing a connection structure that includes conductor layers and at least one insulator layer. The conductor layers in this case are arranged with a parallel spacing along a first direction that is parallel to the active layer of the layer stack structure, and at least one insulator layer is arranged between at least two conductor layers. Furthermore, at least one or more of the conductor layers are electrically connected to the p-doped layer of the layer stack structure.

Further advantageous features of the invention are disclosed in the detailed description of the embodiments and in the claims.

BRIEF DESCRIPTION OF THE DRAWINGS

In the following, the invention is explained in detail with reference to the appended drawings, which show the following.

Shown schematically in FIG. 1 are a layer stack structure and an electronic connection structure according to one embodiment.

Shown schematically in FIG. 2 is a layer stack structure that is electrically subdivided by insertion of at least one insulator layer, such that at least two partial layer stacks are created, according to one embodiment.

Shown schematically in FIG. 3 is semiconductor device with an alignment of the partial layer stacks according to one embodiment.

Shown schematically in FIG. 4 is a semiconductor device with an alignment of the partial layer stacks according to another embodiment.

Shown schematically in FIG. 5 are two types of electrical connection between a conductor layer of the connection structure and an n-doped layer of the layer stack structure.

DESCRIPTION OF THE EMBODIMENTS

Preferred embodiments of the present invention are described in detail in the following with reference to the appended drawings. In the various drawings, elements that are the same, or that correspond, are in each case designated by the same or similar references.

The preferred embodiments of the invention, which are described in detail below, are described in detail with respect to a semiconductor device for emitting electromagnetic radiation, in particular for emitting light from structures having a light-emitting surface of a spatial length scale from a few micrometres to a hundred or several hundred nanometres. It is noted, however, that the following description contains only examples, and should not be regarded as limiting the invention.

Figure 1:
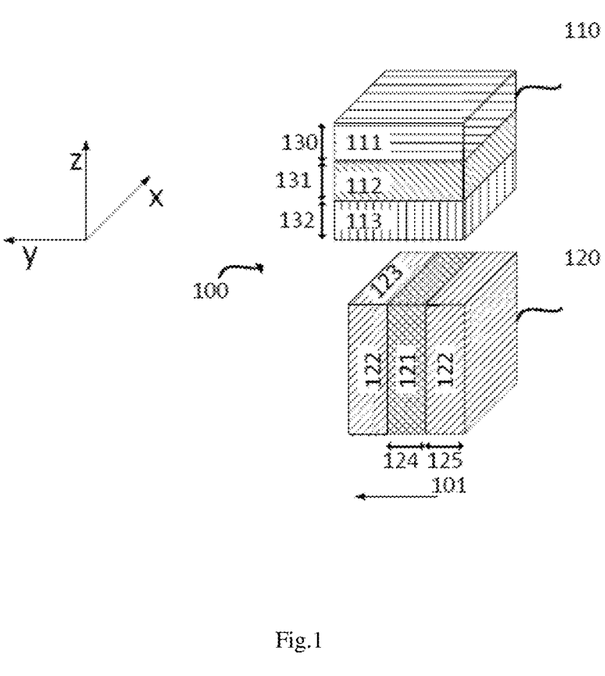

Shown schematically in FIG. 1 are elements of a semiconductor device 100 for emitting electromagnetic radiation. A layer stack structure 110 is shown, which has at least one semiconductor material and which comprises the three layers, a p-doped layer 113, an active layer 112, and an n-doped layer 111.

A layer stack structure in this case is a structure composed of a plurality of layers stacked one on top of the other, for example made of the same semiconductor material.

The n-doped layer, active layer and p-doped layer correspond in this case to layers having the dopings and properties from semiconductor technology known to persons skilled in the art, for example with respect to light-emitting diodes (LED).

It is shown that the layers are arranged one above the other in parallel, and the active layer is located between an n-doped and a p-doped layer, corresponding to the basic arrangement of an LED.

A layer may be described, for example, as a cuboid having two mutually parallel lateral surfaces that can be defined as a base area. The surface area of this base area in this case is a multiple of the area of the lateral surfaces of the cuboid, such that the base area is the volume-determining element of this cuboid. In the borderline case of very thin layers, or a small cuboid height, a layer may also be abstracted as a mathematical surface.

Furthermore, for example, the respective layers may be described as mathematical surfaces in a plane (x, y), or by the base area of the cuboids discussed above. In this case each surface/base area, or each cuboid, is arranged parallel to the other surfaces/base areas of the other cuboids, or cuboids. Furthermore, the surface/cuboid that describes an active layer is located between two surfaces/cuboids that, respectively, describe a p-doped and n-doped layer. The parallel arrangement of the surfaces described above is then along the z-axis, as shown, for example, in FIG. 1.

The n-doped layer 111 of FIG. 1 in this case preferably has a layer thickness 130 of 1000-5000 nm. The active layer 112 in this case preferably has a layer thickness of 10-300 nm. According to the standard of an efficient LED, the active layer 112 preferably has a quantum well structure consisting of a plurality of individual layers. The respective layers in this case correspond either to barriers or quantum wells. The quantum wells in this case are each separated by barriers, or quantum wells and barriers alternate. The quantum well layers in this case have a thickness of 2-5 nm, and consist of active material, for example AlAs, GaN or AlGaAs. The barrier layers in this case have a thickness of 8-15 nm, and consist of non-active material, for example semiconductor materials such as silicon or silicon nitride. The p-doped layer 113 in this case preferably has a layer thickness 132 of 50-300 nm.

With reference to the above-discussed concept of a layer as a cuboid, the layer thickness described here in each case may be interpreted as the height of a cuboid described above.

By way of example, the choice of the thin layer thickness of a respective p-doped layer achieves a low conductivity that is parallel to the extension plane of the active layer, or a small lateral current expansion of the p-doped layer, here in the x-y direction.

Furthermore, a connection structure 120 is shown, which comprises conductor layers made of an electrically conductive material 122 and insulator layers 121 made of an electrically insulating material. Examples of suitable materials are $SiO_2$, silicon nitride and plastics, and air can also be an insulator.

The conductor layers 122 are arranged, parallel to and spaced apart from one another, along and preferably orthogonally in relation to a first direction 101, which is parallel to the active layer 112 of the layer stack structure 110. At least one insulator layer 121 is arranged between at least two conductor layers 122.

Here, too, the respective layers may be described, with the description discussed above, as surfaces or cuboids. The connection structure in this case is similar in the arrangement of the individual layers of the layer stack structure, as described above, this arrangement being tilted in relation to the layer stack structure, for example by 90 degrees, such that the layers of the connection structure are substantially orthogonal to the layers of the layer stack.

In other words, the individual layers of the layer stack structure are arranged vertically in relation to the main extension plane of the active layer. The main extension plane here corresponds to the plane in which the active layer mainly extends. The active layer is arranged between n-doped and p-doped layers. The conductor layers are furthermore arranged, parallel to and spaced apart from one another, in a lateral direction 101, which is parallel to the main extension plane of the active region.

For example, the respective layers of the connection structure may be abstracted as mathematical surfaces in the (x, z) plane, with each surface being arranged in parallel, having the same area, and at least one surface that describes an insulator layer being arranged between two surfaces that describe a conductor layer. The parallel arrangement of the surfaces described above is then along the y-axis.

The conductor layers 122 and insulator layers 121 each have a layer thickness 124, 125 of 10-5000 nm, and preferably a layer thickness 124, 125 of 200-2000 nm.

The resulting structure may be described as lamellar-type. With reference to the concept, discussed above, of a layer as a cuboid, the layer thickness described here may be described as the height of a cuboid whose base area is a multiple, e.g. a hundred times, of its lateral surfaces.

As a possible embodiment, a respective conductor layer may also be sub-structured along its direction of propagation, i.e. in FIG. 1 in the x-direction, in order to generate individual pixels instead of a line. For example, a conductor layer may consist of a plurality of partial conductor layers, e.g. in strip form, having a longitudinal axis in the z-direction and a transverse axis in the x-direction exist, which are elongate in form and are arranged, parallel to and spaced apart from one another, within the extension plane of a conductor layer.

For example, such a connection structure may be produced by arranging conductive strips, as partial conductor layers, on a layer of insulating material, and then again a layer of insulating material, etc. One end of the strips may then be contacted to the p-doped layer, and the other end to a current source, as a result of which electromagnetic radiation is then generated in the layer above the p-doped layer when current flows. Another example is that the conductor layers are sub-structured, on the part of the edge 123 electrically contacting the layer stack structure, by chemical etching, for example similar to a successive sequence of sawtooth functions, rectangular functions or triangular functions.

The region of light emission can advantageously be reduced by the small layer thickness of the conductor paths, due to the small current expansion.

The connection structure described above is arranged substantially perpendicularly in relation to the layer stack structure. The term "substantially perpendicularly" may be understood here, for example, as an angular orientation close to 90 degrees, for example in a range of from 70-110 degrees.

In other words, the connection structure is tilted in relation to the layer stack structure in the sense that the base areas of the layers of the layer stack have an angular orientation greater than zero in relation to the base areas of the layers of the connection structure.

Furthermore, one or more conductor layers 122 are electrically connected to the p-doped layer 113 of the layer stack structure.

Owing to the use of an electrically conductive material, the above-mentioned p-doped 113 and n-doped layers 111 can be contacted, such that a current flows and electromagnetic radiation can be emitted. The conductor layers 122 described can thus be used as power supply leads for a semiconductor structure, for example a light-emitting diode.

The electrical connections in this case may be produced, for example, by alloying or sintering methods, such as pressure sintering, silver sintering (as a transfer method), alloying by applying a voltage to two parallel conductor paths, applying a very thin metal layer on the P side, which is not laterally conductive. Advantageously, the contacting can be improved by the application of a very thin metal layer, since there is an ohmic resistance.

The layer stack structure may be produced, for example, by epitaxy methods known to persons skilled in the art, especially organo-metallic vapour epitaxy (MOVPE, MOCVDE).

The connection structure may be produced, for example, from different carrier materials, by applying layers to one another, for example by vapour deposition. For example, the methods of physical vapour deposition (PVD), plasma-assisted chemical vapour deposition (PECVD), atomic layer deposition (ALD) or sputtering techniques, known to persons skilled in the art, may be used here.

The layer stack structure 110 shown here is in this case preferably based on the material system of the group III nitrides or the group III phosphides or the group III arsenides. The active layer in this case comprises at least one semiconductor material from the group of AlGaN, GaN, InGaN (electromagnetic radiation having a wavelength in the range 300-500 nm, corresponding to ultraviolet and blue light), GaP, InGaP, InGaAlP (electromagnetic radiation having a wavelength in the range 600-800 nm, corresponding to red light), GaAs and InGaAs. In general, however, the semiconductor materials may also be selected from the following groups: (Al, In, Ga)As, (Al, In, Ga)P or (Al, In, Ga)N. Here, the indication of the possible material combinations with brackets means that at least one of the three materials within brackets may be combined with the respective material outside the brackets, for example two possible material combinations of the first group (Al, In, Ga)As the following: GaAs or InAs. Clearly, a plurality of materials within the brackets may also be combined.

The materials from which the insulating layers of the connection structure are made are, for example, plastics, silicon nitrides or silicon dioxides. However, other alternatives are known to persons skilled in the art. Accordingly, the citing of these examples cannot be understood as limiting. Advantageously in this case, the use of silicon dioxides, since these are amorphous on thin layers, achieves increased flexibility of the power supply leads that are provided by the connection structure.

The materials from which the conductor layers of the connection structure are made in this case are, for example, silver, copper or gold. Here, too, the use of the materials mentioned makes it possible to achieve a high degree of flexibility in the power supply leads provided by the connection structure.

Preferably, at least a part of the edge 123 of the one or more conductor layers 122 of the connection structure 120 is electrically connected to the p-doped layer 113 of the layer stack structure 110. This means that the conductor layers are substantially perpendicular to the p-doped layer 113, and are electrically connected to it via the parts of their edges 123.

The part of the edge 123 of a respective conductor layer 122 may in this case be described as a fraction, for example a quarter, of the edge of the surface described by the respective conductor layer. In other words, the part of the edge of a respective conductor layer may be described as a part of the total lateral surface, for example a quarter of the total lateral surface, of a cuboid whose base area is a multiple of its total lateral surface.

Advantageously, the use of the very thin conductor layers within the connection structure, in combination with the electrical contact between the p-doped layer and parts of the edge of the conductor layers, makes it possible to achieve a very small lateral current expansion in the corresponding p-doped region, especially with use of materials from the group of group III nitrides.

The extent of these connection points, or contact points, can be limited in one direction by the layer thickness of the conductor layers of the connection structure. These contacts, or electrical connections, can thus advantageously generate an emission of electromagnetic radiation that is limited to the extent of the corresponding contact points, or connection points. This can increase the resolution.

Figure 2:
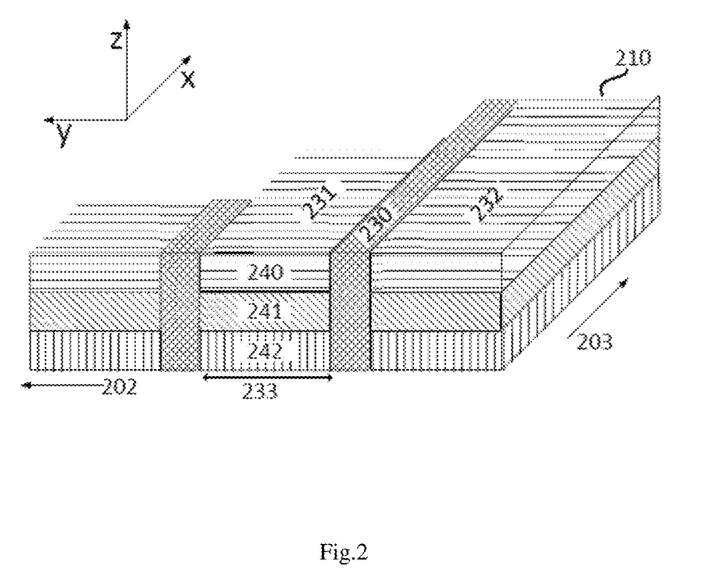

Shown schematically in FIG. 2 is a subdivision of the layer stack structure 110 into at least two partial layer stacks 231, 232, which are electrically insulated from one another and arranged parallel to one another, by use of an insulator layer 230 according to a preferred embodiment.

A respective partial layer stack has all of the features of a layer stack structure that are described above. Specifically, it has a p-doped layer 242, an n-doped layer 240 and an active layer 241. As already described, these layers are arranged one above the other.

The partial layer stacks are arranged, parallel to and spaced apart from one another, along a second direction 202 (y) that is parallel to the active layer 241 of the layer stack structure 210.

In other words, the layer stack structure 210 is subdivided along a first direction 203 lying within the main extension plane of the active region. This is effected so as to create partial layer stacks 231, 232 arranged parallel to each other, spaced apart along a second direction 202 that lies within the main extension plane of the active region 241, and at least one insulator layer 230 is arranged between two of these partial layer stacks 231, 232.

The subdivision of the layer stack structure 210 into partial layer stacks 231, 232 that are electrically insulated from one another, for example by an insulator layer 230, enables a current expansion in the p-doped layer of a particle layer stack in the direction of the second direction 202 to be further reduced.

According to a preferred embodiment, the partial layer stacks 231, 232 represented in FIG. 2 are formed in such a way that they have a longitudinal axis 203 that is at right angles to the arrangement direction 202 of the parallel partial layer stacks.

In other words, the at least two partial layer stacks 231, 232 are formed in such a way that they have a longitudinal axis 203 orthogonal to the second direction 202.

This means that the partial layer stacks 231, 232 have a longitudinal axis 203 that is parallel to the main extension direction 203 of the at least one insulator layer 230 that insulates the at least two partial layer stacks 231, 232 from each other.

The longitudinal axis 203 in this case is characterized in that a respective partial layer stack 231, 232 is expanded many times further in this direction (x) compared to the expansion in the other two directions (y, z).

In other words, the longitudinal axis 203 corresponds to the direction of the longest lateral edge (x) of the respective cuboid that describes the respective partial layer stack 231, 232. The cuboid in this case has two further lateral edges in two directions (y, z) which, in relation to a third lateral edge, in the third direction (x), are shorter by a multiple, e.g. ten times. The second direction 202 (y) is vertical in relation to the longitudinal axis 203 (x) of a partial layer stack 231, 232 and parallel to the main extension plane (x, y) of the active region 241.

The partial layer stacks of the layer stack structure 210 preferably have an extent 233 of 50-5000 nm in the second direction 202, vertical in relation to their longitudinal axis 203, and preferably an extent of 200-2000 nm.

As a result, the current expansion along the second direction 202 can advantageously be limited to the expansion width 233. As a result, the resolution of the semiconductor device can be increased.

Figure 3:
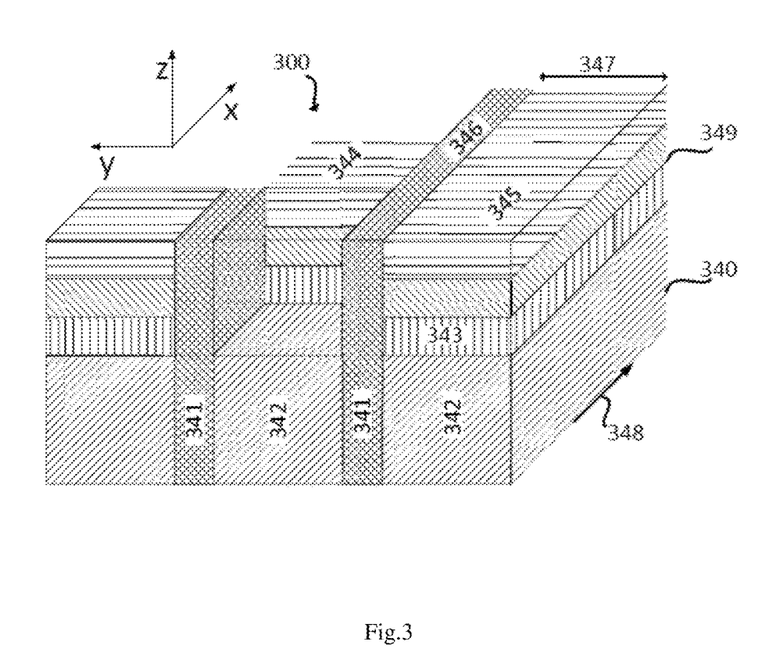

Shown schematically in FIG. 3 is an exemplary arrangement 300 of the partial layer stacks 344, 345 of a layer stack structure 349 and of a connection structure 340 composed of insulator layers 341 and conductor layers 342 of a semiconductor device 300. Here, the at least two partial layer stacks 344, 345, separated from one another by an insulator layer 346, are aligned in such a manner that a respective conductor layer 342 of the connection structure is electrically connected to at most one p-doped layer 343 of a respective partial layer stack 345.

In other words, each partial layer stack 344, 345 is aligned such that it is connected only to conductor layers 342 of the connection structure 340 that are electrically connected only to the respective partial layer stack. This means that the connection structure 340 is aligned in such a manner that none of the conductor layers 342 of the connection structure 340 is electrically connected to a plurality, that is to say at least two, partial layer stacks 344, 345. Each of the conductor layers 342 of the connection structure 340 is thus aligned such that its main extension plane intersects only the base area of the cuboid that is described by the p-doped layer 343 of a partial layer stack 345.

For example, the connection structure 340 and the partial layer stacks 344, 345 may be aligned in relation to one another in such a manner that the conductor layers 342 are arranged substantially parallel, for example in an angular range of −10 to +10 degrees, in relation to the main propagation direction 348 of the corresponding partial layer stacks 344, 345, including the extent 347 vertical to the longitudinal axis 348 of the respective partial layer stacks 344, 345.

In this way, an arrangement of several, individually controllable, very fine lines, vertical in relation to their longitudinal axis due to their small extent 347, can be produced. Advantageously, the resolution of the semiconductor device can thus be increased.

Furthermore, the conductor layers of the connection structure may have a smaller layer thickness (10-5000 nm, preferably 200-2000 nm) than the extent of the partial layer stacks (50-5000 nm, preferably 200-2000 nm).

For example, 10 conductor layers having a layer thickness of 10 nm and the associated insulator layers having a layer thickness of 10 nm could be connected to a partial layer stack having an extent of 200 nm.

The intensity of the emitted electromagnetic waves of the lines created in this way can then be selectively set via the number of conductor layers 342 that electrically contact the p-doped layer 343 of a respective partial layer stack. This means that the more conductor layers that are switched to carry current, the higher the current that can be selected through the p-doped layer.

Figure 4:
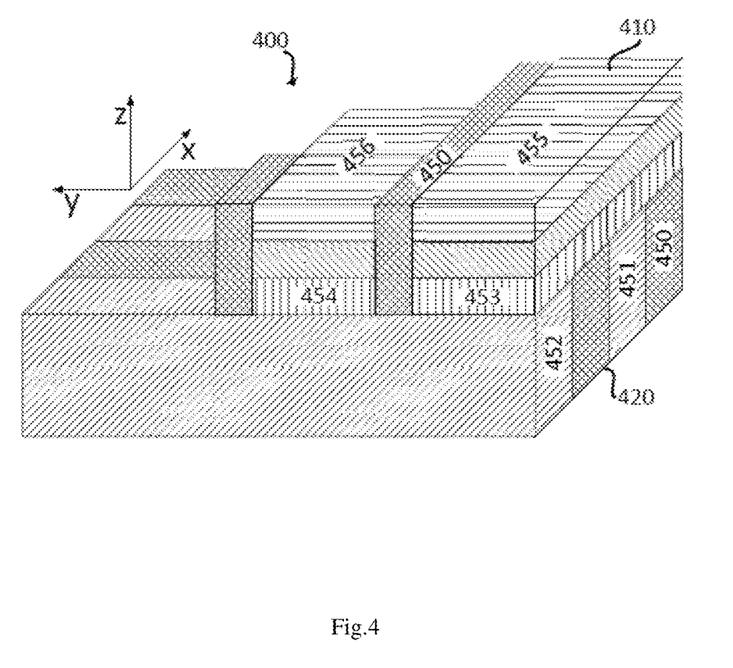

Shown schematically in FIG. 4 is an exemplary arrangement 400 of the layer stack structure 410 and of the connection structure 420 according to another preferred embodiment of a semiconductor device. In this case, the at least two partial layer stacks 455, 456 are aligned in such a manner that a respective conductor layer 451, 452 of the connection structure 420 is electrically connected once each to the p-doped layer of the at least two partial layer stacks 455, 456.

In other words, the connection structure 420 is oriented such that the respective conductor layers 451, 452 are in each case connected to the p-doped layer of at least two different partial layer stacks 455, 456.

For example, the connection structure 420 and the partial layer stacks 455, 456 may be aligned in relation to one another such that the conductor layers 451, 452 are arranged substantially perpendicularly, for example in an angular range of 80-100 degrees, in relation to the main propagation plane of the at least one insulator layer 450 that electrically insulates the at least two sub-layer stacks 455, 456 from each other.

In this way, advantageously, an arrangement of a plurality of controllable, electromagnetic wave-emitting regions, or pixels or surface elements, can be achieved. These may have an extent in the sub-micrometre range in at least one direction parallel to the active layer, owing to the low current expansion within the p-doped layer of a respective partial layer stack.

For example, with reference to the exemplary embodiment represented in FIG. 4 and the represented coordinate system 24 (x, y, z), the radiation region of a surface element is determined in the x-direction by the layer thickness of the conductor layers 451, 452, and in the y-direction by the width of the partial layer stack 455, 456.

As in all embodiments shown, the electromagnetic radiation is emitted from the active layer substantially in the z-direction. This results in a coupling-out of structured light on the n-doped side. The size of the electrically excited volume element, and in particular its cross section in the x-y plane, determines the optical resolution to be achieved.

In particular, the arrangement 400 of the connection structure under the layer stack structure makes it possible to reduce the cross section of the device, which can be formed in such a manner that the layer stack structure is not significantly larger than the area of the light emission. Thus, a light-emitting surface can have the most compact dimensions possible and can be inserted into a narrow tube in order there to generate structured illumination.

The fluorescence generated by the electromagnetic radiation can thereby be limited to a very small spatial region, which allows a very high resolution using the biological analysis methods described above.

Described in the following is a type of electrical contacting, between the connection structure and the layer stack structure, that can be used in general, applied in the case of each of the described embodiments.

Figure 5:
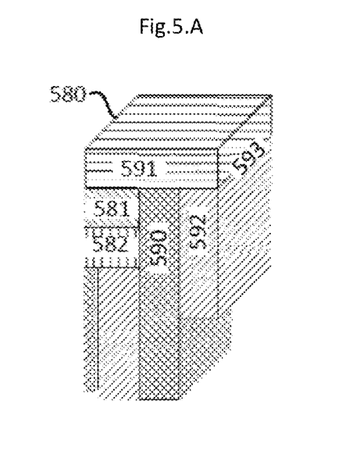

Shown schematically in FIG. 5.A, 5.B are two exemplary electrical contactings 593, 596 between a conductor layer 592, 594 and an n-doped layer 591, 595.

FIG. 5.A shows schematically how a respective conductor layer 592 and a respective n-doped layer 591 are electrically connected vertically 593 in relation to one another. In this case, the n-doped layer 591 of the layer stack structure 580 projects beyond the active layer 581 and the p-doped layer 582. Furthermore, an additional insulator layer 590, which runs parallel to the conductor layer 592, electrically insulates the conductor layer 592 from the active layer 581 and the p-doped layer 582 of the layer stack structure 580.

FIG. 5.B shows schematically the case of a respective conductor layer 594 and a respective n-doped layer 595 of a layer stack structure 580 being electrically connected 596 parallel to one another. Furthermore, an additional insulator layer 590, which runs parallel to the conductor layer 594, electrically insulates the conductor layer 594 from the active layer 581 and the p-doped layer 582 of the layer stack structure 580. Furthermore, an additional insulator layer 590 surrounds the conductor layer 594.

The n-doped regions 591, 595 of the layer stack structure 580 of the semiconductor structure described can easily be electrically contacted in the two ways described above. Specifically, each n-doped layer of a partial layer stack can be individually controlled by being electrically contacted, as shown in FIG. 5.A or FIG. 5.B.

FIG. 5.C shows an example of how each n-doped layer is individually controlled by being electrically contacted, as shown in FIG. 5.A. Specifically, here two partial layer stacks 580 and 583 are each electrically contacted 593, 599 by a respective conductor layer. In this case, they are electrically insulated from one another by an insulator layer 597, such that each partial layer stack 580, 583 can be controlled individually by control of the conductor layer 592 598 belonging to the respective contacting 593, 599.

Figure 6:
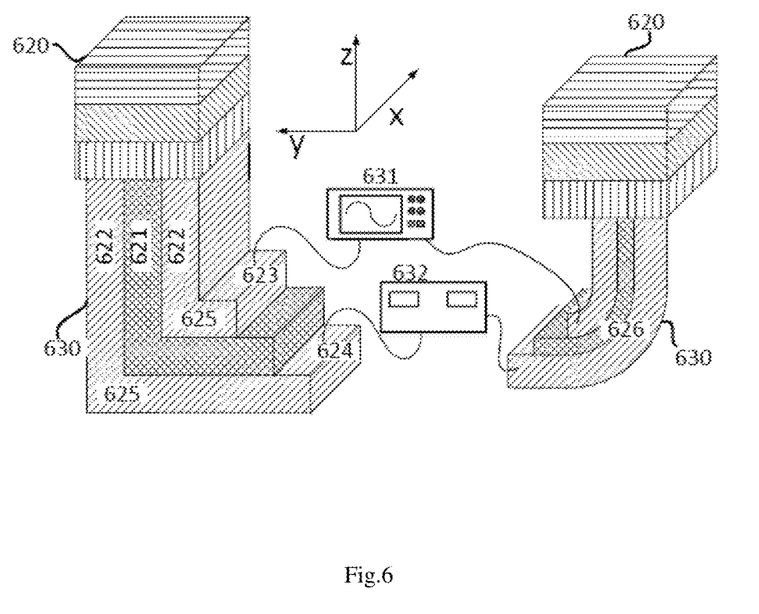
FIG. 6 shows an example of how conductor layers can be spread out and contacted.

FIG. 6 shows an example of how the conductor layers 622 can be spread out and connected, or contacted, to power sources and/or control units 631, 632. The conductor layers 622 connected to the layer stack structure 620 upwards in the z direction of the indicated x, y, z coordinate system are shown here in an L-shape, kinked at a right angle at a point on the conductor layer 625. The degree of kink at a point, or location, 625 of the respective conductor layers 622 may also not be right-angled, for example the bend could assume different degrees in the range of between 0 and 90 degrees. Furthermore, the conductor layer may also be bent instead of kinked. This bend then corresponds to a curvature of the conductor layer, the conductor layer not being kinked at a specific point 625, but instead being continuously bent, for example to form an arc of a particular fraction of a circle or, specifically, a quarter circle 626. Each conductor layer 622 in this case has an end point 623, 624 that is offset in relation to a next conductor layer and that is connected to a current source and/or control unit 631, 632. The resulting spreading-out can advantageously be used to contact each individual conductor layer in a simple and space-saving manner, e.g. by use of solder points of 5-21 micrometres in size.

Figure 7:
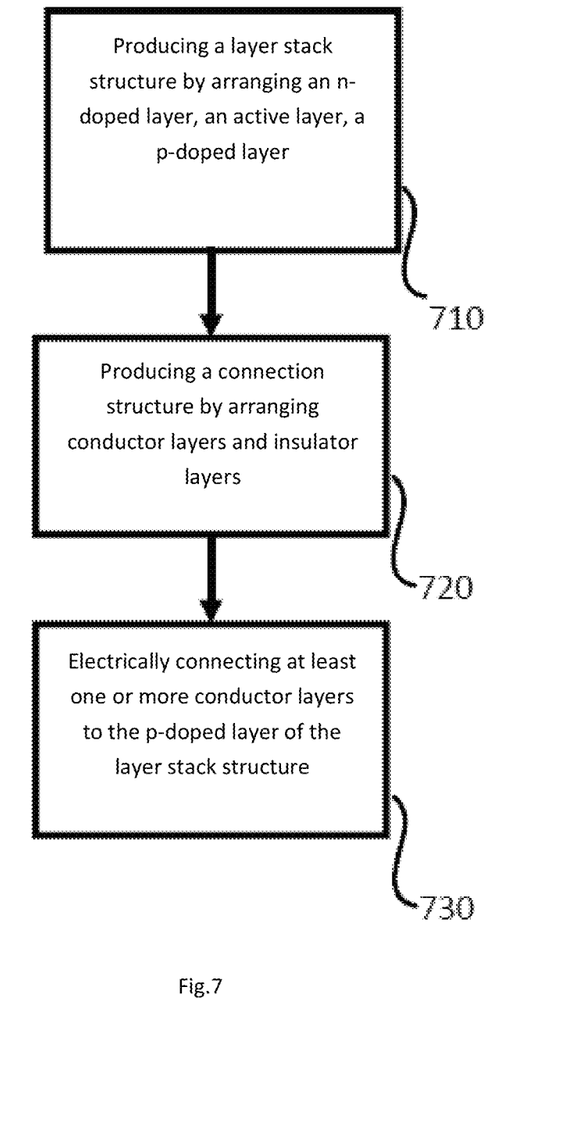
FIG. 7 shows a production method for the semiconductor device.

FIG. 7 shows steps of a production method. Firstly, by arranging 710 an active layer between an n-doped and a p-doped layer, a layer stack structure is produced, which has the properties of a light-emitting diode, or LED, known to persons skilled in the art. Furthermore, a connection structure is produced by layered arranging of conductor layers. In this case, for example, a conductor layer is successively applied to an insulator layer, and a further insulator layer is applied to the applied conductor layer. The conductor layers and insulator layers in this case are composed of the materials mentioned above. The resulting connection structure 630 may be created, for example, by applying the said layers piece by piece, or in layers, on a flexible carrier material. The carrier material can also be removed later. The latter production method step for producing a connection structure may also be performed before the production of the layer stack structure. The layer stack structure 620 is then electrically connected to the connection structure 630 at the appropriate locations, as described above. For this purpose, reference is made, for example, to the types of electrical connection, or electrical contacting, described above with reference to FIGS. 5.A and 5.B. Thus, a semiconductor device is obtained as a matrix-type LED array.

From the preceding description, persons skilled in the art will also understand that various modifications and variations of the devices represented, and of the method of the invention, may be effected without departure from the scope of the invention.

Furthermore, the invention has been described with reference to particular examples, which, however, are intended only to improve understanding of the invention, and are not intended to limit it. Persons skilled in the art will also readily appreciate that many different combinations of the elements may be used to implement the present invention. Therefore, the true scope of the invention is characterized by the following claims.

The invention claimed is:

1. A semiconductor device for emitting electromagnetic radiation, comprising:
    at least one layer stack structure, having at least one semiconductor material, which comprises the following:
    at least one n-doped layer,
    at least one active layer, which is designed to emit electromagnetic radiation during operation, and
    at least one p-doped layer,
    the layers being arranged in parallel one above the other, and the active layer being located between an n-doped and a p-doped layer, and
    the semiconductor device furthermore comprising
    a connection structure comprising conductor layers and at least one insulator layer,
    the conductor layers being arranged, parallel to and spaced apart from one another, along a first direction that is parallel to the active layer of the layer stack structure, and at least one insulator layer being arranged between at least two conductor layers, one or more conductor layers being electrically connected to the p-doped layer of the layer stack structure, the layer stack structure being electrically subdivided by the insertion at least one insulator layer, such that there are created at least two partial layer stacks that are arranged, parallel to and spaced apart from one another, along a second direction that is parallel to the active layer of the layer stack structure, the at least two partial layer stacks being formed in such a way that they have a longitudinal axis orthogonal to the second direction, the conductor layers and/or the insulator layers of the connection structure each having a layer thickness of 10-5000 nm, and preferably 200-2000 nm, and a respective partial layer stack of the at least two partial layer stacks of the layer stack structure having an extent of 50-5000 nm, and preferably of 200-2000 nm, vertical in relation to its longitudinal axis.

2. The semiconductor device according to claim 1, at least a part of the edge of the one or more conductor layers of the connection structure being electrically connected to the p-doped layer of the layer stack structure.

3. The semiconductor device according to claim 1, the at least two partial layer stacks being aligned in such a manner that a respective conductor layer of the connection structure is electrically connected to at most one p-doped layer of a respective partial layer stack.

4. The semiconductor device according to claim 1, the at least two partial layer stacks being aligned in such a manner that a respective conductor layer of the connection structure is electrically connected to the p-doped layer of the first partial layer stack and to the p-doped layer of the second partial layer stack of the at least two partial layer stacks.

5. The semiconductor device according to claim 1, the connection structure being arranged substantially perpendicularly in relation to the layer stack structure.

6. The semiconductor device according to claim 1, the n-doped layer being electrically contacted.

7. The semiconductor device according to claim 1, either a respective conductor layer and a respective n-doped layer being electrically connected vertically in relation to the n-doped layer, or a respective conductor layer and a respective n-doped layer being electrically connected parallel to the n-doped layer.

8. The semiconductor device according to claim 1, the conductor layers of the connection structure being each individually electrically contacted.

9. The semiconductor device according to claim 1, the layer stack structure being based on the material system of the group III nitrides or the group III phosphides or the group III arsenides.

10. The semiconductor device according to claim 9, the active layer comprising at least one semiconductor material from the group (Al, In, Ga)As, (Al, In, Ga)P, or (Al, In, Ga)N.

11. A method of producing a semiconductor device for emitting electromagnetic radiation, comprising the steps of:

producing a layer stack structure, having at least one semiconductor material, by superimposing an n-doped layer, an active layer designed to emit electromagnetic radiation during operation, and a p-doped layer, the active layer being located between an n-doped and a p-doped layer, and producing a connection structure that includes conductor layers and at least one insulator layer, by arranging conductor layers, with a parallel spacing along a first direction that is parallel to the active layer of the layer stack structure, and arranging at least one insulator layer between at least two conductor layers, electrically connecting at least one or more conductor layers to the p-doped layer of the layer stack structure, comprising the further steps of:

electrically subdividing the layer stack structure by the insertion at least one insulator layer, such that there are created at least two partial layer stacks that are arranged, parallel to and spaced apart from one another, along a second direction that is parallel to the active layer of the layer stack structure, forming the at least two partial layer stacks in such a way that they have a longitudinal axis orthogonal to the second direction, wherein the conductor layers and/or the insulator layers of the connection structure each has a layer thickness of 10-5000 nm, and preferably 200-2000 nm, and a respective partial layer stack of the at least two partial layer stacks of the layer stack structure has an extent of 50-5000 nm, and preferably of 200-2000 nm, vertical in relation to its longitudinal axis.

\* \* \* \* \*